(12) United States Patent
Van Pelt

(10) Patent No.: US 11,879,918 B2
(45) Date of Patent: Jan. 23, 2024

(54) METHODS, DEVICES, AND SYSTEMS FOR NIP CALIBRATION

(71) Applicant: Stowe Woodward Licensco LLC, Youngsville, NC (US)

(72) Inventor: Wesley C. Van Pelt, Appleton, WI (US)

(73) Assignee: STOWE WOODWARD LICENSCO LLC, Youngsville, NC (US)

( * ) Notice: Subject to any disclaimer, the term of this patent is extended or adjusted under 35 U.S.C. 154(b) by 111 days.

(21) Appl. No.: 17/673,420

(22) Filed: Feb. 16, 2022

(65) Prior Publication Data

US 2023/0258701 A1 Aug. 17, 2023

(51) Int. Cl.
G01R 27/02 (2006.01)
G01R 33/58 (2006.01)
G01R 33/00 (2006.01)
G01R 35/00 (2006.01)
H04Q 9/00 (2006.01)

(52) U.S. Cl.
CPC .............. *G01R 27/02* (2013.01); *H04Q 9/00* (2013.01); *G01R 33/0023* (2013.01); *G01R 33/0035* (2013.01); *G01R 33/58* (2013.01); *G01R 35/005* (2013.01)

(58) Field of Classification Search
CPC ........ G01R 27/00; G01R 27/02; G01R 33/00; G01R 33/0017; G01R 33/0023; G01R 33/0035; G01R 33/58; G01R 35/00; G01R 35/005; H04Q 9/00
USPC .................................................. 324/200, 228
See application file for complete search history.

(56) References Cited

U.S. PATENT DOCUMENTS

| | | | |
|---|---|---|---|
| 4,255,725 A * | 3/1981 | Berger | H03H 15/02 333/173 |
| 5,724,267 A | 3/1998 | Richards | |
| 5,953,230 A | 9/1999 | Moore | |
| 6,205,369 B1 | 3/2001 | Moore | |
| 6,568,285 B1 | 5/2003 | Moore et al. | |

(Continued)

FOREIGN PATENT DOCUMENTS

EP 0813047 A2 12/1997

OTHER PUBLICATIONS

International Search Report and Written Opinion for PCT/US2023/061528 dated May 30, 2023, 9 pages.

*Primary Examiner* — Hoai-An D. Nguyen
(74) *Attorney, Agent, or Firm* — Myers Bigel, P.A.

(57) ABSTRACT

An electronic device for calibrating a nip measuring device associated with nip rollers includes a sensor selection circuit configured to receive signals from a sensor array that includes a plurality of nip sensors that are configured to detect operational parameters of the nip rollers, a plurality of sensor channel lines electrically connected between respective ones of the plurality of nip sensors and the sensor selection circuit, a calibration array including one or more calibration resistors, and a calibration channel line electrically connected between the calibration array and the sensor selection circuit. A signal on a respective one of the plurality of sensor channel lines is configured to be sampled by a respective one of a plurality of gain resistances. A nip sensor resistance of a sensor is determined based on the sampled signal on the sensor channel lines and the gain resistances. Related methods and systems are also described.

20 Claims, 8 Drawing Sheets

(56) References Cited

U.S. PATENT DOCUMENTS

| | | | |
|---|---|---|---|
| 6,601,512 B2* | 8/2003 | Yamamoto | B41F 33/0054 101/364 |
| 7,305,894 B2 | 12/2007 | Moore et al. | |
| 7,629,799 B2 | 12/2009 | Murphy | |
| 2003/0221491 A1 | 12/2003 | Albert et al. | |
| 2005/0000303 A1 | 1/2005 | Moore et al. | |
| 2005/0278135 A1* | 12/2005 | Murphy | G01L 5/102 374/E1.001 |
| 2009/0257808 A1* | 10/2009 | Krucinski | G03G 15/6529 400/582 |
| 2014/0303926 A1 | 10/2014 | Sessego et al. | |
| 2016/0094196 A1* | 3/2016 | Lee | H03F 3/45 333/2 |

* cited by examiner

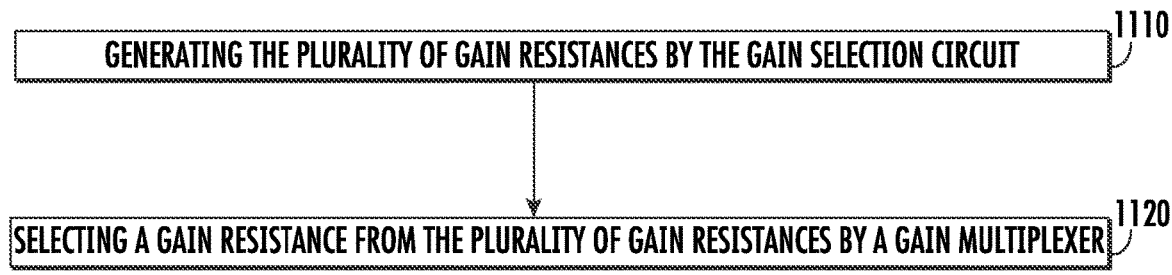
FIG. 11
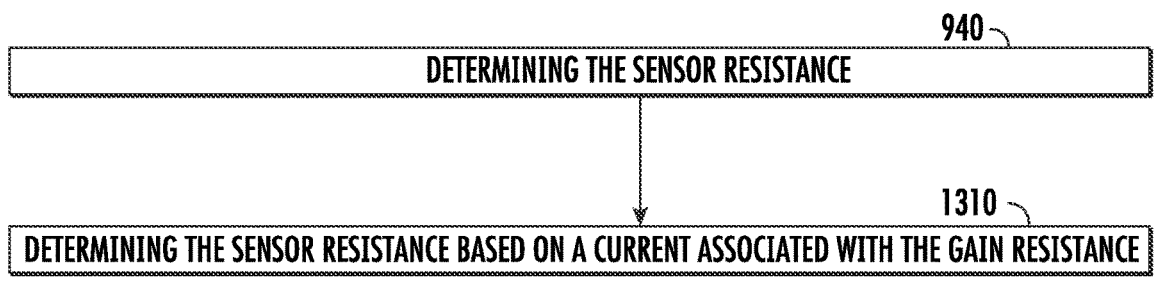
FIG. 12
FIG. 13

METHODS, DEVICES, AND SYSTEMS FOR NIP CALIBRATION

FIELD

Various embodiments described herein relate to nip measuring devices, and more specifically to calibration of a nip measuring device used in connection with nipped rollers such as those used in papermaking, steel making, plastics calendering, and/or printing machines.

BACKGROUND

Nip rollers, also referred to as nipped rolls or pinch rollers, are used in a vast number of continuous process industries including papermaking, steel making, plastics calendering, and/or printing. Nip rollers are used to press two or more sheets of a material together. The characteristics of nip rollers are particularly important in papermaking. Two or more nip rollers may press together, exerting force on the paper or types of sheets therebetween. Various nip sensors may be used to monitor the pressure or other characteristics of the nip rollers during operation. The amount of nip pressure applied to the sheets may be important in achieving uniform sheet characteristics. Variations in nip pressure can affect sheet moisture content and sheet properties. Excessive pressure can cause crushing of fibers as well as holes in the resulting paper product.

SUMMARY

Various embodiments of the present inventive concepts are directed to an electronic device for calibrating a nip measuring device associated with nip rollers. The electronic device includes a sensor selection circuit configured to receive signals from a sensor array that includes a plurality of nip sensors that are configured to detect operational parameters of the nip rollers, a plurality of sensor channel lines electrically connected between respective ones of the plurality of nip sensors and the sensor selection circuit, a calibration array including one or more calibration resistors, and a calibration channel line electrically connected between the calibration array and the sensor selection circuit. A signal on a respective one of the plurality of sensor channel lines is configured to be sampled by a respective one of a plurality of gain resistances. A nip sensor resistance of a corresponding one of the plurality of nip sensors is determined based on the sampled signal on the respective one of the plurality of sensor channel lines and the respective one of the plurality of gain resistances.

According to some embodiments, the electronic device may include a gain selection circuit configured to generate the plurality of gain resistances. The electronic device may include a core analog circuit configured to receive an output of the sensor selection circuit and an output of the gain selection circuit. The nip sensor resistance may be determined based on an output of the core analog circuit and the output of the gain selection circuit. The core analog circuit may include an operational amplifier that is configured to receive a voltage associated with a selected one of the plurality of gain resistances from the gain selection circuit at an inverting input, and configured to receive a reference voltage at a non-inverting input of the operational amplifier. The core analog circuit may be configured to output a voltage signal based on the nip sensor resistance and at least one of the plurality of gain resistances.

According to some embodiments, the one or more calibration resistors may include a single calibration resistor. The calibration channel line may be configured to be sampled by the plurality of gain resistances to determine a selection circuit internal resistance. The calibration channel line may be configured to be sampled by the plurality of gain resistances to determine a gain circuit internal resistance. The calibration resistors may include a plurality of calibration resistors, and the calibration channel line may include a plurality of calibration channel lines. A group of the plurality of calibration channel lines may be configured to be sampled by the plurality of gain resistances to determine a selection circuit internal resistance. A group of the plurality of calibration channel lines may be configured to be sampled by the plurality of gain resistances to determine a gain circuit internal resistance. The sensor selection circuit may include one or more sensor multiplexers. The gain selection circuit may include one or more gain multiplexers.

Various embodiments of the present inventive concepts are directed to a method of calibrating a nip measuring device associated with nip rollers. The method includes receiving signals at a sensor selection circuit from a sensor array that includes a plurality of nip sensors that are configured to detect operational parameters of the nip rollers, applying a respective one of a plurality of gain resistances to a calibration array including one or more calibration resistors, and sampling a sensor signal selected from the signals received from a plurality of sensor channel lines based on the respective one of the plurality of gain resistances. The plurality of sensor channel lines are connected between respective ones of the plurality of nip sensors and the sensor selection circuit. The method includes determining a nip sensor resistance of a corresponding one of the plurality of nip sensors based on the sampling of the sensor signal on a respective one of the plurality of sensor channel lines with the respective one of the plurality of gain resistances.

According to some embodiments, determining the nip sensor resistance may include determining the nip sensor resistance based on an output of a core analog circuit and an output of a gain selection circuit that is configured to select the respective one of the plurality of gain resistances. The method may include generating the plurality of gain resistances by the gain selection circuit, and selecting a gain resistance from the plurality of gain resistances by a gain multiplexer. The method may include generating, by an operational amplifier, the output of the core analog circuit based on a voltage associated with the gain resistance that was selected at an inverting input of the operational amplifier, and based on a reference voltage at a non-inverting input of the operational amplifier. Determining the nip sensor resistance based on an output of a core analog circuit and an output of the gain selection circuit may include determining the nip sensor resistance based on based on a current associated with the gain resistance. The one or more calibration resistors may include a single calibration resistor, and a calibration channel line may be electrically connected between the calibration resistor and the sensor selection circuit. The sensor selection circuit may include a sensor multiplexer.

Various embodiments of the present inventive concepts are directed to a nip measuring device circuit configured to calibrate a nip measuring device. The nip measuring device circuit includes a sensor multiplexer configured to receive signals from a sensor array that includes a plurality of nip sensors that are configured to detect operational parameters of nip rollers, a gain multiplexer configured to receive a plurality of gain resistances, a plurality of sensor channel lines electrically connected between respective ones of the plurality of nip sensors and the sensor multiplexer, a calibration resistor, and a calibration channel line connected between the calibration resistor and the sensor multiplexer. The nip sensor resistance of a selected one of the plurality of nip sensors is determined based on a sampled signal on a respective one of the plurality of sensor channel lines associated with the selected one of the plurality of nip sensors and a respective one of the plurality of gain resistances selected by the gain multiplexer.

It is noted that aspects of the inventive concepts described with respect to one embodiment, may be incorporated in a different embodiment although not specifically described relative thereto. That is, all embodiments and/or features of any embodiment can be combined in any way and/or combination. Other operations according to any of the embodiments described herein may also be performed. These and other aspects of the inventive concepts are described in detail in the specification set forth below.

BRIEF DESCRIPTION OF THE DRAWINGS

The accompanying drawings are included to provide a further understanding of the present disclosure and are incorporated in and constitute a part of this application. These drawings illustrate certain example embodiments. In the drawings:

FIGS. 9 to 13 are flowcharts of operations for calibrating nip measuring devices, according to various embodiments described herein.

DETAILED DESCRIPTION

Various embodiments will be described more fully hereinafter with reference to the accompanying drawings. Other embodiments may take many different forms and should not be construed as limited to the embodiments set forth herein. Like numbers refer to like elements throughout.

Nip sensors, also referred to as sensors, may be placed on nip rollers to monitor operational parameters of the nip rollers such as pressure, loading, deflection, size, rotational direction, rotational speed, and/or other characteristics. The sensors may be part of a nip measuring device that discerns these various operational parameters from the sensors and sends to a processor, hardware, software, firmware, and/or a user interface. The nip measuring device may need to be calibrated in order to sense the parameters of the sensors properly. The nip measuring device may be calibrated during manufacturing or calibrated manually by the user during operation of the nip rollers. However, manual calibration may be inconvenient as it may be a time consuming process and/or may require training of the operator to properly calibrate the nip measuring device. Various embodiments of the present inventive concepts arise from the recognition of a need to automatically calibrate the nip measuring device at the time of use of the nip rollers using known, fixed resistance elements on unused nip sensor channels.

Figure 1:
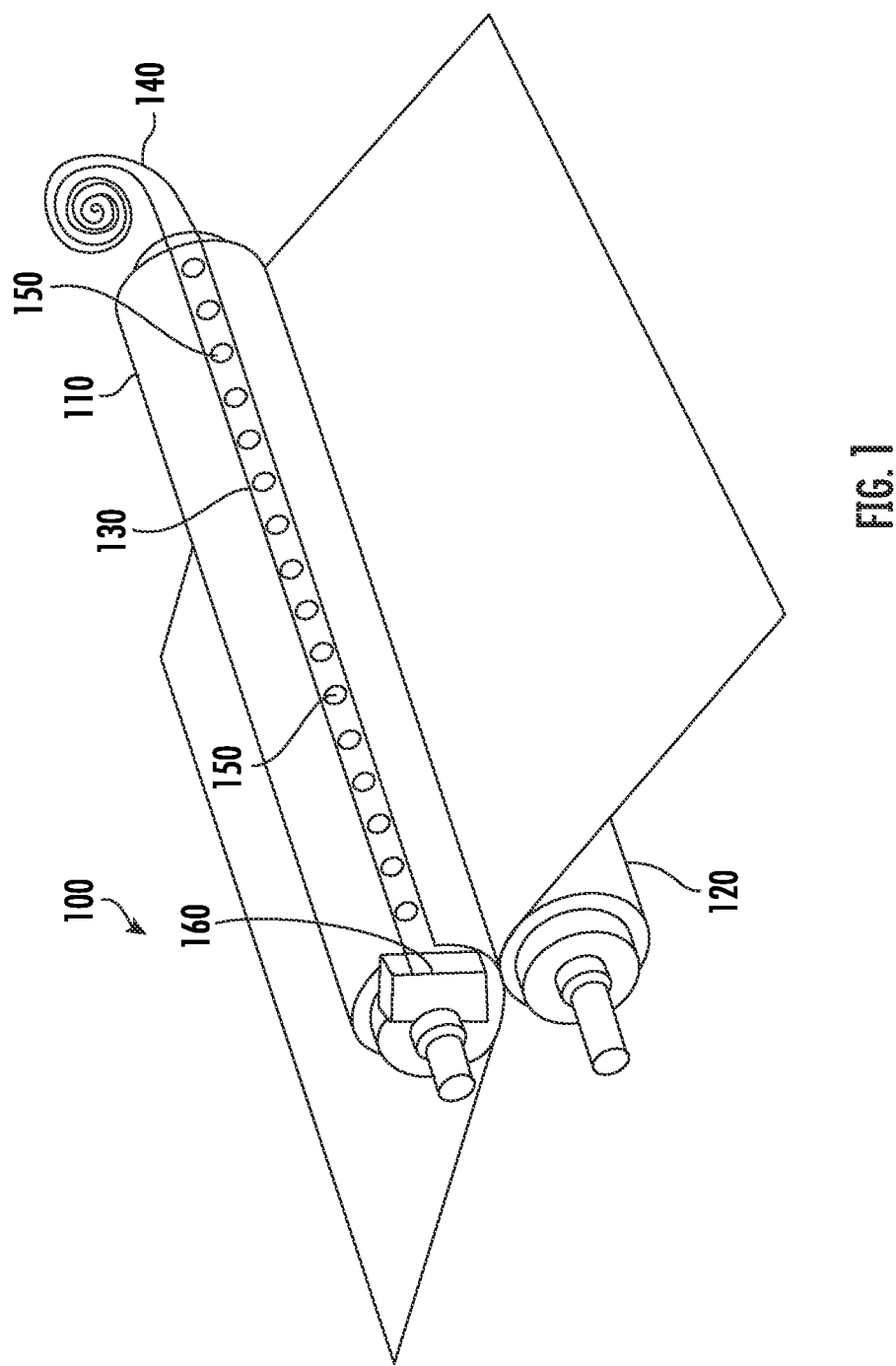
FIG. 1 is a diagram of a papermaking system, according to various embodiments described herein.

FIG. 1 is a diagram of a papermaking system, according to various embodiments described herein. Referring to FIG. 1, the papermaking system includes a nip sensing system 100 and a nip press section that includes nip rollers 110 and 120. In a nip press section of a papermaking machine, nip rollers 110 and 120 may rotate and squeeze a web of fibrous material therebetween. In order for the nip rollers 110 and 120 to provide uniform pressure to a fibrous web, nip rollers 110 and 120 must be evenly loaded and the width of contact between the rollers, i.e. the nip width, should be within a predetermined range.

Still referring to FIG. 1, the nip sensing system 100 includes a strip 130 that may be an elongated thin film material. The strip 130 may be rolled into a coil 140 for storage of unused sensors. Sensors 150 may be fixed to the strip 130 such that the sensors 150 may sense pressure, force, nip width, and/or other operational parameters of the nip rollers 110 and 120. Although the strip 130 is shown herein as mounted adjacent the rollers 110, 120, in some embodiments, the strip 130 may be detached and separate from the nip rollers 110, 120, such that it is present only during sensing and not during typical operation of the nip roller 110, 120.

A nip measuring device 160 may include electronic components and/or circuits connected to the sensors 150. The electronic components and/or circuits of the nip measuring device 160 may provide a voltage across each sensor 150 and measure the sensor resistance by monitoring the current flow through the sensor, or may provide a current through each sensor and measure the sensor resistance by monitoring the voltage drop across the sensor. The nip measuring device 160 may be directly connected to the strip 130 and/or sensors 150. In some embodiments, the nip measuring device 160 may have a wireless interface to the sensors 150.

Figure 2:
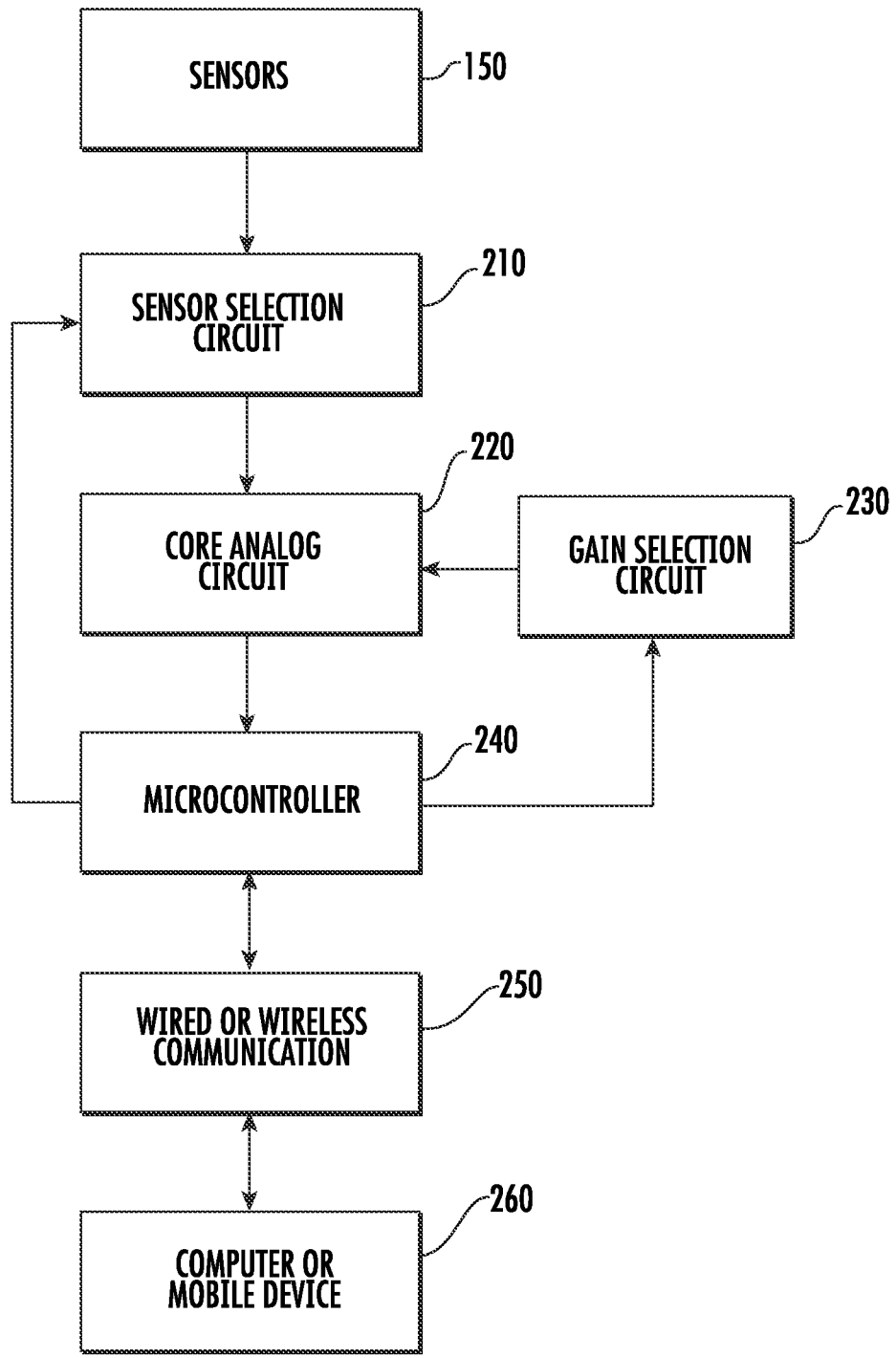
FIG. 2 is a diagram of various components of a nip calibration device used for calibrating sensors in the papermaking system of FIG. 1, according to various embodiments described herein.

FIG. 2 is a diagram of data acquisition flow for various components of a nip calibration device used for calibrating sensors in the nip sensing system 100 of FIG. 1. Referring to FIG. 2, sensors 150 may be electrically connected to sensor selection circuit 210. A microcontroller 240, that may include one or more processors and/or memory devices, may control the sensor selection circuit 210 and/or the gain selection circuit 230. Core analog circuit 220 may receive signals from the sensor selection circuit 210 and/or gain selection circuit 230. The microcontroller 240 may communicate via a wired connection or a wireless connection 250 with a computer or mobile device 260 that may interface with a user of the nip sensing system 100.

According to various embodiments described herein, the nip sensing system 100 calibrates itself so that there is not a need to calibrate it manually during operation, calibrate it during manufacturing, or to use the same constants for each of the sensors 150 as a default, which would provide less accuracy. A calibration module that may be co-located with the sensors may be used to find the calibration values accurately, but would require the user to use the calibration module before attaching a sensor. Calibration could also be done during manufacturing, but would add complexity to the manufacturing process. Additionally, calibration during manufacturing would have the risk that the accuracy of the calibration may drift with temperature or time during actual use of the nip measuring system. Furthermore, measuring sensor resistances during manufacturing may introduce inaccuracy due to compounding errors due to manufacturing tolerances. The automatic calibration solution for the nip measuring device arose from the recognition, when studying the sensor resistance calculation equations, that the calibration values may be determined by using some of the unused sensor channels with fixed resistances, obtaining measurements, and solving equations to determine the sensor resistances. Various embodiments described herein avoid having to go through the tedious process of finding these sensor resistances manually.

Figure 3:
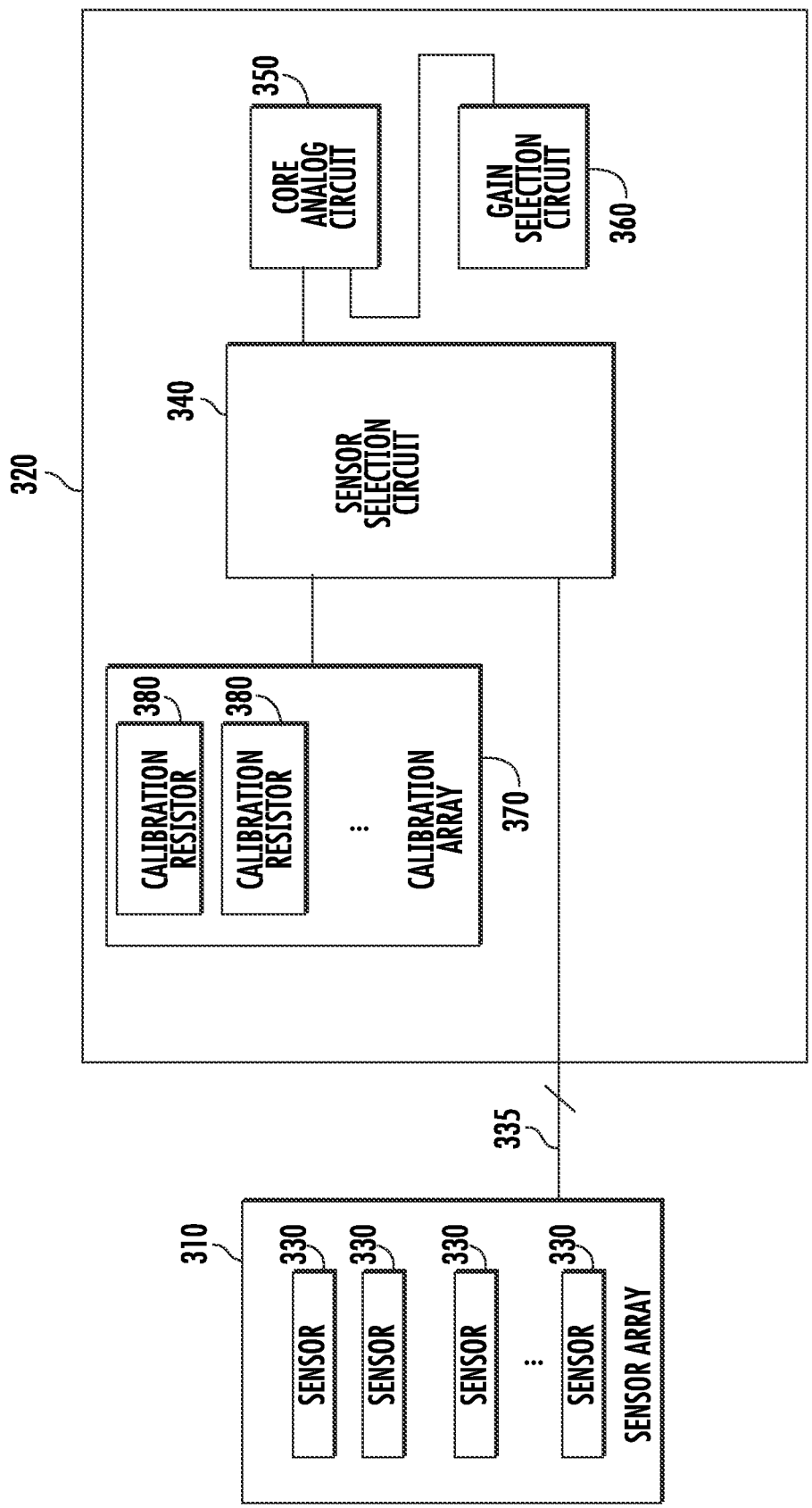
FIG. 3 is a block diagram of a nip calibration device associated with various nip sensors, according to various embodiments described herein.

FIG. 3 is a block diagram of a nip calibration device associated with various nip sensors. Referring to FIG. 3, a sensor array 310 includes one or more sensors 330 that may correspond to sensors 150 of FIGS. 1 and/or 2. A sensor array may include a number of sensors 330 which share at least one of their sensor channel lines 335 with other sensors 330 in the array. Sensor channel lines 335 refer to what the sensors are electrically connected to. For example, the sensor channel lines 335 may be used to connect to a multiplexer to allow for many ones of the sensors 330 to be connected at once without having duplicated circuitry, as will be further discussed with respect to FIG. 6.

Still referring to FIG. 3, an electronic device 320 may be connected to sensor array 310 by sensor channel lines 335. The electronic device 320 may be part of, work in conjunction with, be in communication with, and/or be co-located with the nip measuring device 160 of FIG. 1. Electronic device 320 includes a sensor selection circuit 340 that is connected to a calibration array 370, core analog circuit 350, and a gain selection circuit 360. The calibration array 370 may include one or more calibration resistors 380.

Figure 4:
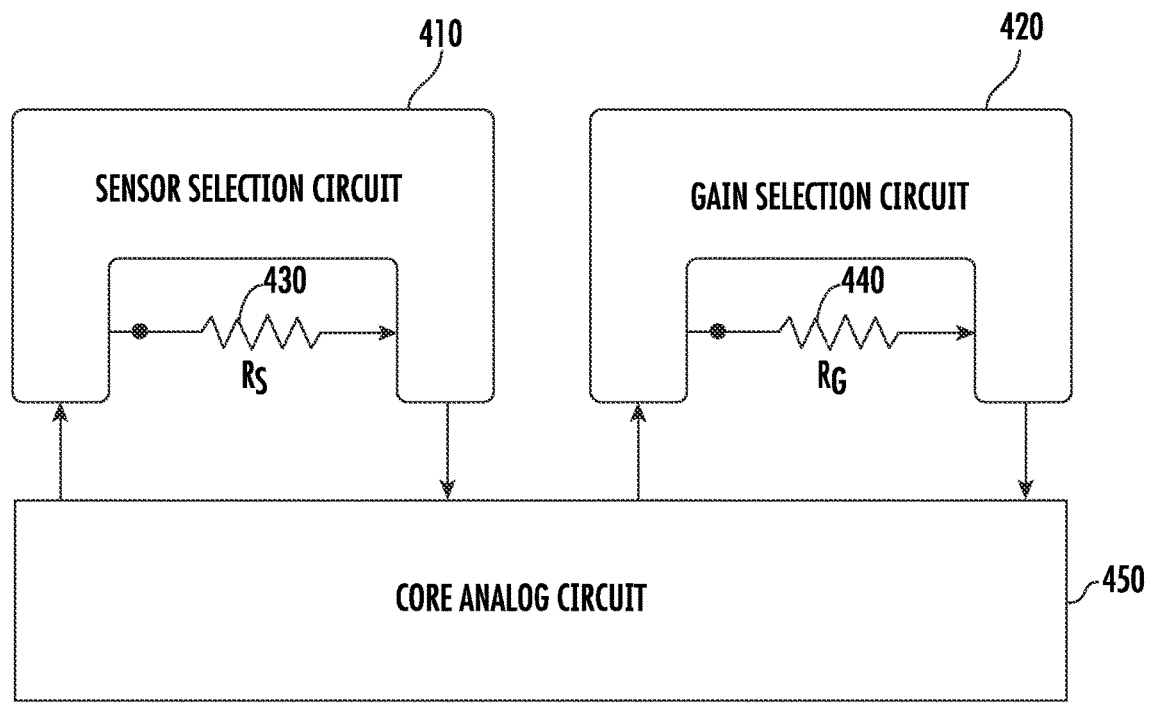
FIGS. 4 to 8 are circuits for nip calibration, according to various embodiments described herein.

FIG. 4 illustrates a circuit used for nip calibration. Referring to FIG. 4, a sensor selection circuit 410, which may correspond to the sensor selection circuit 210 of FIG. 2 or the sensor selection circuit 340 of FIG. 3, may have a sensor resistance 430. A gain selection circuit 420, which may correspond to the gain selection circuit 230 of FIG. 2 or the gain selection circuit 360 of FIG. 3, may be modeled as having a gain resistance 440. The sensor selection circuit 410 and the gain selection circuit 420 may be electrically connected to core analog circuit 450, which may correspond to the core analog circuit 220 of FIG. 2 or the core analog circuit 350 of FIG. 3. Some channels of the sensor selection circuit 340 may be configured to read known fixed values to calculate errors, instead of reading sensor values.

Generally, both the sensor and gain selection circuitry may include an arrangement of one or more analog multiplexer chips and/or discrete logic components. For example, example implementations of the circuits described herein may use Nexperia part number 74HCT4067BQ-Q100J, MAX336CPI+, and/or CD4067BM96. This selection circuitry may add some amount of resistance which can skew measurements, particularly when the sensor resistance is low. The added resistance of the selection circuitry is modeled in FIG. 5.

Figure 5:
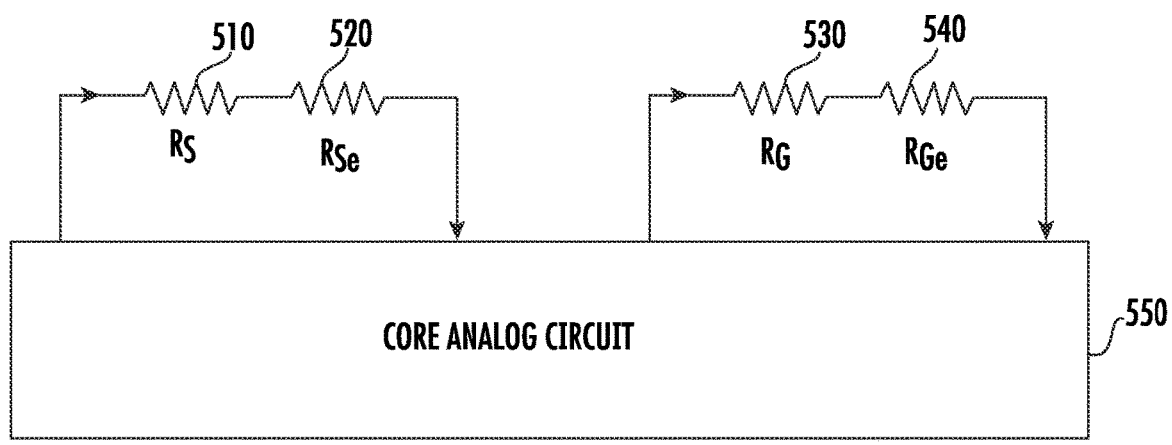

FIG. 5 illustrates a circuit model used for nip calibration. Referring to FIG. 5, the resistance that is added by the sensor selection circuit 410 and the gain selection circuit 420 of FIG. 4 may be respectively represented as $R_{Se}$ and $R_{Ge}$. Specifically, the sensor selection circuit 410 of FIG. 4 may have a sensor resistance 510 and a sensor selection circuit resistance 520. The gain selection circuit 420 of FIG. 4 may have a gain resistance 530 and a gain selection circuit resistance 540. The sensor resistance 510, the sensor selection circuit resistance 520, the gain resistance 530, and the gain selection circuit resistance 540 may be electrically connected to the core analog circuit 550.

Figure 6:
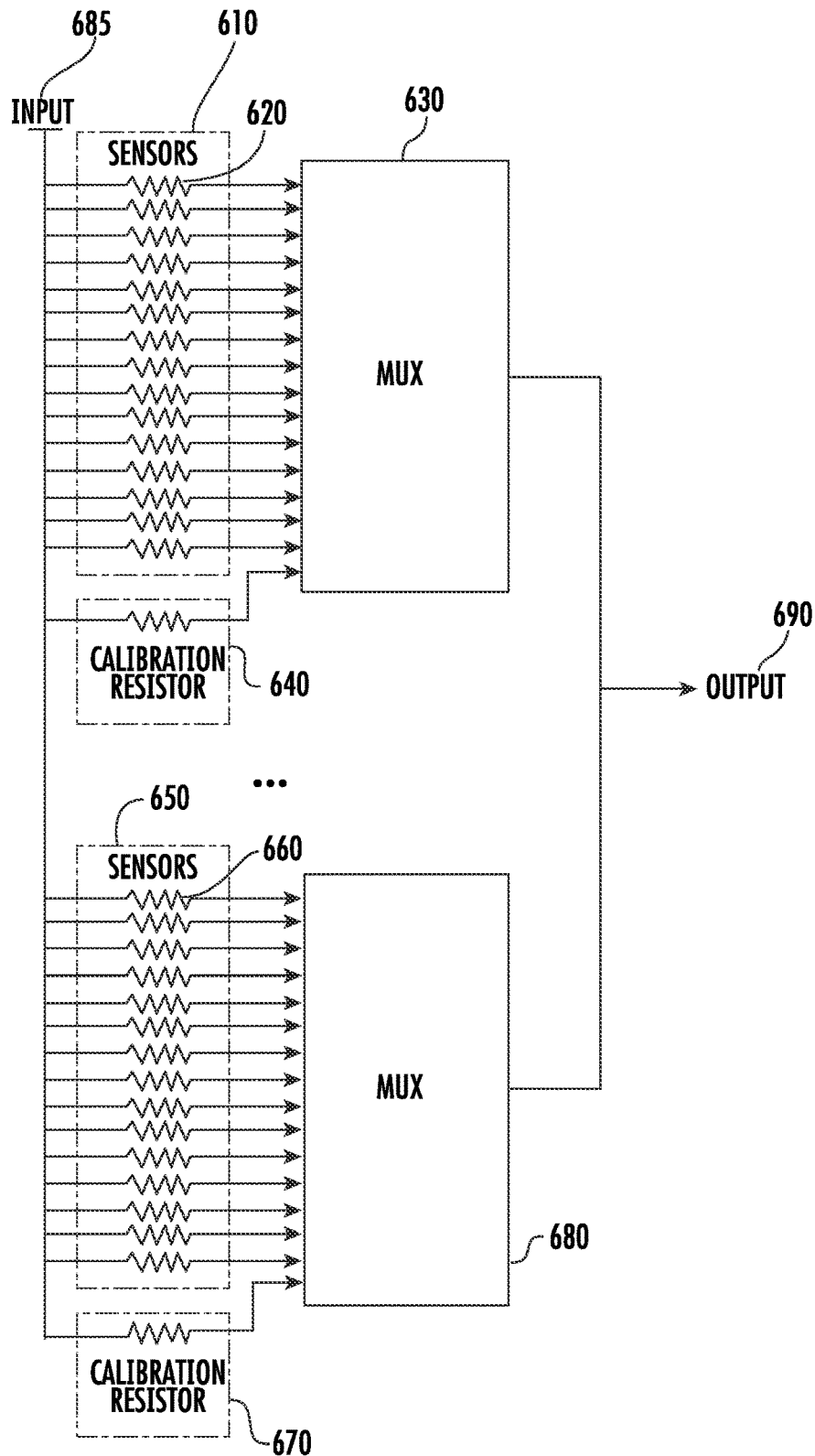

FIG. 6 illustrates a circuit used for nip calibration. Depending on the sensor arrangement and construction, there may be varying amounts of complexity involved in the arrangement of the multiplexer chips in relation to the sensors. Referring to FIG. 6, a simple, single-dimensional array of sensors may be arranged using at least one multiplexer in the sensor selection circuit. FIG. 6 illustrates a non-limiting example with two multiplexers 630 and 680. Two multiplexers may be used in this example if a single multiplexer chip does not have enough ports to support the number of sensors.

Figure 8:
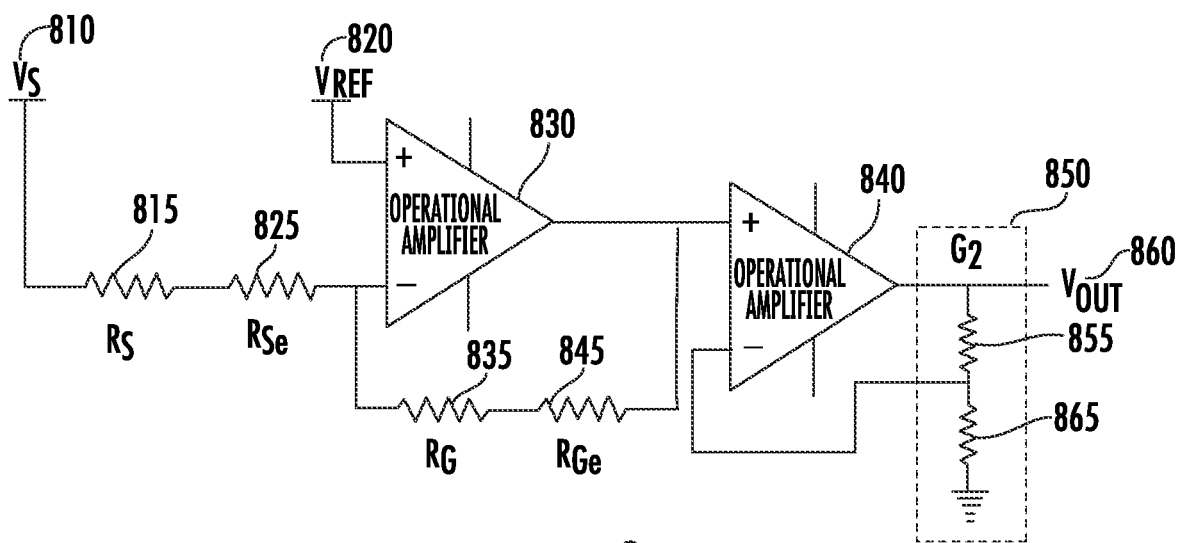

Still referring to FIG. 6, an array of sensors 610 that includes one or more sensors 620 is electrically connected to inputs (i.e., channels) of multiplexer 630. A calibration resistor 640 is also electrically connected to an input (i.e., an unused channel) of the multiplexer 630. Depending on the number of sensors, a second multiplexer 680 may be used. An array of sensors 650 that includes one or more sensors 660 is electrically connected to inputs of multiplexer 680. A calibration resistor 670 is also electrically connected to an input of the multiplexer 680. Logically, multiplexers 630 and 680 may behave as a single sensor selection circuit, according to some embodiments. Sensors 620 and 660 as well as calibration resistors 640 and 670 may be connected to an input 685 power rail, such as 5V. Multiplexers 630 and 680 provide output signal lines that are connected to a core analog circuit that may include a transimpedance amplifier that may be implemented with one or more operational amplifiers, such as illustrated in FIG. 8.

A key contributor to $R_{Se}$ and $R_{Ge}$ are the multiplexer chips that are used in the circuit. For example, on a Nexperia chip, the difference in resistance between different input/output (IO) channels may be about an order of magnitude lower than difference in resistance from chip to chip. For optimal calibration and practicality, a single channel of each of the sensor multiplexers is connected to a known resistance instead of a sensor. Gain multiplexers do not need a calibration resistor since the gain resistances are known, unlike sensor resistances.

Figure 7:
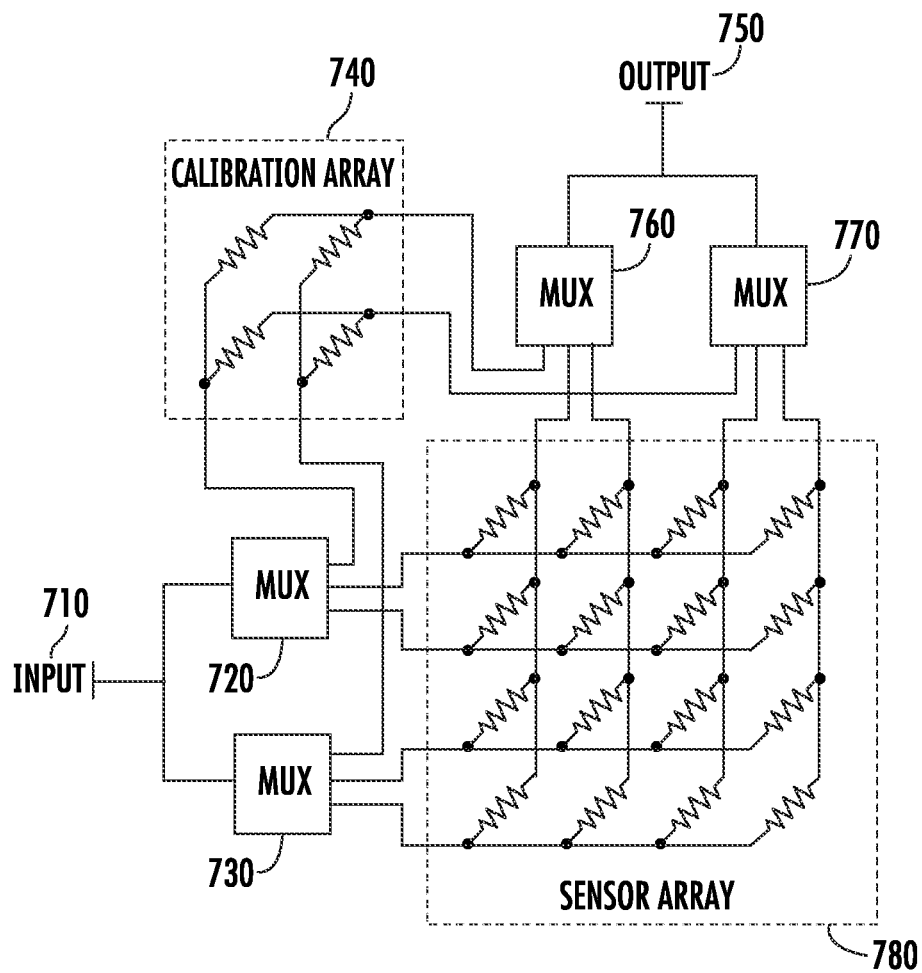

FIG. 7 illustrates an example two-dimensional sensor array with calibration resistors. In general, calibration resistances must be in the same configuration as sensors with respect to the width of the arrays. Referring to FIG. 7, a 4×4 sensor array 780 uses two 1:3 multiplexers 720 and 730 on the input 710 and two 3:1 multiplexers 760 and 770 on the output 750 to allow for a 2×2 calibration array 740.

In practice, four 1:8 or 1:16 multiplexers may be used, with the latter allowing for up to a 30×30 sensor array while still using a 2×2 calibration array. The arrays are not limited to square configurations. For example, a 15×45 sensor array could be used with one input multiplexer and three output multiplexers and a 1×3 calibration array. In some embodiments, another layer of multiplexing could also be added to one of the dimensions, in order to reduce the complexity of mathematical calculations for determining the sensor resistance.

The calibration resistances may be sampled using different gain resistances to calculate the resistances added by the sensor selection circuit 410 and the gain selection circuit 420 of FIG. 4, $R_{Ge}$ and $R_{Se}$, for each group of channels on a multiplexer. When a sensor resistance is calculated, different values for $R_{Se}$ and $R_{Ge}$ will need to be calculated and used depending on which multiplexers are being used for a particular channel. A transimpedance amplifier circuit may be used as part of the core analog circuit to aide in determining $R_{Ge}$ and $R_{Se}$.

FIG. 8 illustrates an example core analog circuit that may correspond to the core analog circuits of any of FIGS. 2 to 5. Referring to FIG. 8, the core analog circuit may include an operational amplifier 830 whose inverting input is connected to the output of the sensor selection circuit (e.g., the output 690 of multiplexer 630 of FIG. 6). $R_{Se}$ 825 may represent the resistance of the sensor selection circuit and $R_S$ 815 may represent the resistance of a sensor 620 that has been selected by multiplexer 630. The sensor resistance $R_S$ 815 is connected to an input voltage 810, such as 5V. The inverting input of operational amplifier 830 is also connected to the gain selection circuit of any of FIGS. 2 to 5. $R_{Ge}$ 845 may represent the resistance of the gain selection circuit and $R_G$ 835 may represent the gain resistance by the gain selection circuit. The gain selection circuit may include a multiplexer, such as multiplexer 680 of FIG. 6. The non-inverting input of operational amplifier 830 is connected to a reference voltage 820. Reference voltage 820 may be, for example, 2.5V. In this non-limiting example, since the input voltage 810 may be 5V and reference voltage 820 may be 2.5V, a drop of 2.5 V occurs across $R_S$ 815 and $R_{Se}$ 825 and can be used to determine the values of $R_S$ and $R_{Se}$.

Based on the properties of operational amplifier 830, the sensor resistance $R_S$ 815 can be found with the following formula:

$$R_S f(V_{out}) * (R_G + R_{Ge}) - R_{Se}$$

where:

$$f(V_{out}) = \frac{V_{in} - V_{ref}}{V_{ref} - \frac{V_{out}}{G_2}}$$

$V_{in}$ is the input voltage to the sensor, which corresponds to input 685 of FIG. 6. $V_{out}$ 860 is the output voltage from the core analog circuit (i.e., the transimpedance amplifier circuit). $R_G$ 835 is the gain resistance. $R_{Ge}$ 845 and $R_{Se}$ 825 are resistances introduced to the circuit in the gain and sense portions respectively. $V_{ref}$ 820 and $G_2$ 850 are determined by other portions of the transimpedance amplifier circuit that includes operational amplifier 840, which scales the output of operational amplifier 830. Resistor 855 and resistor 865 provide the scaling needed for the gain value $G_2$.

By rearranging the equation for $R_S$, and solving a system of equations, $R_{Ge}$ and $R_{Se}$ can be found as:

$$R_{Ge} = \frac{f(V_{out1}) * R_{G1} - f(V_{out2}) * R_{G2}}{f(V_{out2}) - f(V_{out1})}$$

$$R_{Se} = f(V_{out}) * (R_G + R_{Ge}) - R_S$$

Two measurements of $R_S$ need to be taken using different gain resistances to find $R_{Ge}$. The calibration resistance used should fall within a range which more than one gain resistance to provide an accurate reading.

For implementation purposes, the calibration resistor may be located on-board with other analog circuitry, or as part of the sensor array so that other resistances, such as in the cabling, for example, will be included in $R_{Se}$. If multiple groups of gain resistors need to be used, there may need to be more than one calibration array to ensure the calibration resistances match up with a few of the gain resistances in the group.

According to some embodiments, discrete logic may be used instead of the multiplexer chips or resistors in the examples. Other forms of resistance either internal or external to the device may be used for calibration. The core analog circuit is described above as being implemented with a transimpedance amplifier circuit as an example, but a voltage divider may be used instead.

Figure 9:
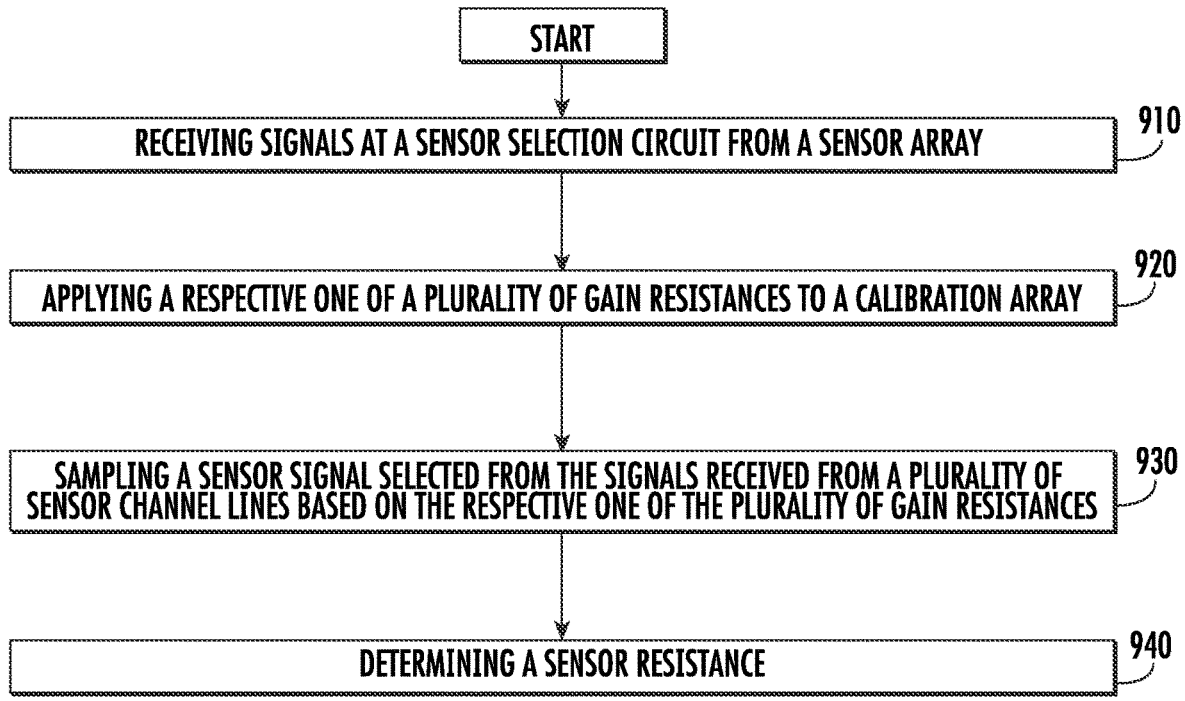

FIG. 9 is a flowchart of operations for calibrating a nip measuring device. Referring to FIG. 9, calibrating a nip measuring device associated with nip rollers may include receiving signals at a sensor selection circuit from a sensor array that includes a plurality of nip sensors that are configured to detect operational parameters of the nip rollers, at block 910. Operations may include applying a respective one of a plurality of gain resistances to a calibration array including one or more calibration resistors, at block 920. Operations may include sampling a sensor signal selected from the signals received from a plurality of sensor channel lines based on the respective one of the plurality of gain resistances, at block 930. The plurality of sensor channel lines are connected between respective ones of the plurality of nip sensors and the sensor selection circuit. Operations may include determining a nip sensor resistance of a corresponding one of the plurality of nip sensors based on the sampling of the sensor signal on a respective one of the plurality of sensor channel lines with the respective one of the plurality of gain resistances, at block 940.

Figure 10:
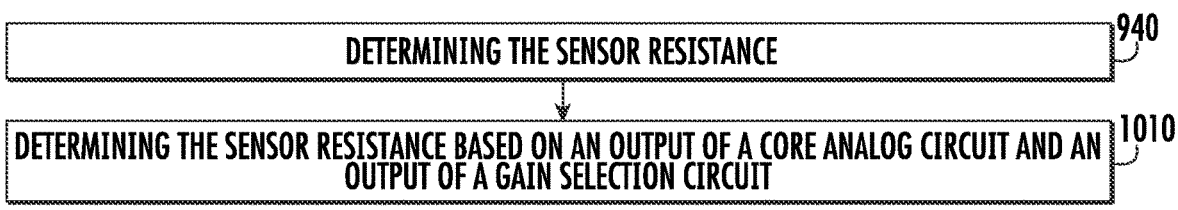

FIG. 10 is a flowchart of operations for calibrating a nip measuring device. Referring to FIG. 10, determining the nip sensor resistance of block 940 of FIG. 9 may include determining the nip sensor resistance based on an output of a core analog circuit and an output of a gain selection circuit that is configured to select the respective one of the plurality of gain resistances, at block 1010.

FIG. 11 is a flowchart of operations for calibrating a nip measuring device. Referring to FIG. 11, operations may further include generating the plurality of gain resistances by the gain selection circuit, at block 1110, and selecting a gain resistance from the plurality of gain resistances by a gain multiplexer, at block 1120.

FIG. 12 is a flowchart of operations for calibrating a nip measuring device. Referring to FIG. 12, operations may include generating, by an operational amplifier, the output of the core analog circuit based on a voltage associated with the gain resistance that was selected at an inverting input of the operational amplifier, and based on a reference voltage at a non-inverting input of the operational amplifier.

FIG. 13 is a flowchart of operations for calibrating a nip measuring device. Referring to FIG. 13, determining the nip sensor resistance of block 940 of FIG. 9 may include determining the nip sensor resistance based on based on a current associated with the gain resistance.

According to various embodiments described herein, automatic calibration of the nip measuring device is accomplished with fixed resistance elements. This automatic calibration of the nip measuring device during operation of the nip measurement system provides a more convenient solution than calibration during manufacturing or manual calibration by the user during operation of measuring the nip rollers. Thus, the embodiments described herein may provide a convenient solution that saves time, reduces manufacturing complexity, does not require training of the operator of the nip measurement system to properly calibrate the nip measuring device, and/or provides better accuracy in the calibration.

In the above-description of various embodiments of the present disclosure, it is to be understood that the terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of this specification and the relevant art, and will not be interpreted in an idealized or overly formal sense unless expressly so defined herein.

When an element is referred to as being "connected", "coupled", "responsive", or variants thereof to another element, it can be directly connected, coupled, or responsive to the other element or intervening elements may be present. In contrast, when an element is referred to as being "directly connected", "directly coupled", "directly responsive", or variants thereof to another element, there are no intervening elements present. Like numbers refer to like elements throughout. Furthermore, "coupled", "connected", "responsive", or variants thereof as used herein may include wirelessly coupled, connected, or responsive. As used herein, the singular forms "a", "an" and "the" are intended to include the plural forms as well, unless the context clearly indicates otherwise. Well-known functions or constructions may not be described in detail for brevity and/or clarity. The term "and/or" includes any and all combinations of one or more of the associated listed items.

It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

As used herein, the terms "comprise", "comprising", "comprises", "include", "including", "includes", "have", "has", "having", or variants thereof are open-ended, and include one or more stated features, integers, elements, steps, components or functions but does not preclude the presence or addition of one or more other features, integers, elements, steps, components, functions or groups thereof.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks. Accordingly, embodiments of the present disclosure may be embodied in hardware and/or in software (including firmware, resident software, microcode, etc.) that runs on a processor such as a digital signal processor, which may collectively be referred to as "circuitry," "a module" or variants thereof.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated. Moreover, although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of various example combinations and subcombinations of embodiments and of the manner and process of making and using them, and shall support claims to any such combination or subcombination. Many variations and modifications can be made to the embodiments without substantially departing from the principles described herein. All such variations and modifications are intended to be included herein within the scope.

The invention claimed is:

1. An electronic device for calibrating a nip measuring device associated with nip rollers, the electronic device comprising:
    a sensor selection circuit configured to receive signals from a sensor array that comprises a plurality of nip sensors that are configured to detect operational parameters of the nip rollers;
    a plurality of sensor channel lines electrically connected between respective ones of the plurality of nip sensors and the sensor selection circuit;
    a calibration array comprising one or more calibration resistors; and
    a calibration channel line electrically connected between the calibration array and the sensor selection circuit,
    wherein a signal on a respective one of the plurality of sensor channel lines is configured to be sampled by a respective one of a plurality of gain resistances, and
    wherein a nip sensor resistance of a corresponding one of the plurality of nip sensors is determined based on the sampled signal on the respective one of the plurality of sensor channel lines and the respective one of the plurality of gain resistances.

2. The electronic device for calibrating the nip measuring device of claim 1, further comprising:
    a gain selection circuit configured to generate the plurality of gain resistances.

3. The electronic device for calibrating the nip measuring device of claim 2, further comprising:
    a core analog circuit configured to receive an output of the sensor selection circuit and an output of the gain selection circuit.

4. The electronic device for calibrating the nip measuring device of claim 3,
    wherein the nip sensor resistance is determined based on an output of the core analog circuit and the output of the gain selection circuit.

5. The electronic device for calibrating the nip measuring device of claim 3,
    wherein the core analog circuit comprises an operational amplifier that is configured to receive a voltage associated with a selected one of the plurality of gain resistances from the gain selection circuit at an inverting input, and configured to receive a reference voltage at a non-inverting input of the operational amplifier.

6. The electronic device for calibrating the nip measuring device of claim 5, wherein the core analog circuit is configured to output a voltage signal based on the nip sensor resistance and at least one of the plurality of gain resistances.

7. The electronic device for calibrating the nip measuring device of claim 1,
    wherein the one or more calibration resistors comprises a single calibration resistor,
    wherein the calibration channel line is configured to be sampled by the plurality of gain resistances to determine a selection circuit internal resistance.

8. The electronic device for calibrating the nip measuring device of claim 7,
    wherein the calibration channel line is configured to be sampled by the plurality of gain resistances to determine a gain circuit internal resistance.

9. The electronic device for calibrating the nip measuring device of claim 1,
    wherein the calibration resistors comprise a plurality of calibration resistors,
    wherein the calibration channel line comprises a plurality of calibration channel lines,
    wherein a group of the plurality of calibration channel lines is configured to be sampled by the plurality of gain resistances to determine a selection circuit internal resistance.

10. The electronic device for calibrating the nip measuring device of claim 9,
    wherein a group of the plurality of calibration channel lines is configured to be sampled by the plurality of gain resistances to determine a gain circuit internal resistance.

11. The electronic device for calibrating the nip measuring device of claim 1,
    wherein the sensor selection circuit comprises one or more sensor multiplexers.

12. The electronic device for calibrating the nip measuring device of claim 2,
    wherein gain selection circuit comprises one or more gain multiplexers.

13. A method of calibrating a nip measuring device associated with nip rollers, the method comprising:

receiving signals at a sensor selection circuit from a sensor array that comprises a plurality of nip sensors that are configured to detect operational parameters of the nip rollers;

applying a respective one of a plurality of gain resistances to a calibration array comprising one or more calibration resistors;

sampling a sensor signal selected from the signals received from a plurality of sensor channel lines based on the respective one of the plurality of gain resistances, wherein the plurality of sensor channel lines are connected between respective ones of the plurality of nip sensors and the sensor selection circuit; and determining a nip sensor resistance of a corresponding one of the plurality of nip sensors based on the sampling of the sensor signal on a respective one of the plurality of sensor channel lines with the respective one of the plurality of gain resistances.

14. The method of calibrating the nip measuring device of claim 13, wherein determining the nip sensor resistance comprises:

determining the nip sensor resistance based on an output of a core analog circuit and an output of a gain selection circuit that is configured to select the respective one of the plurality of gain resistances.

15. The method of calibrating the nip measuring device of claim 14, further comprising:

generating the plurality of gain resistances by the gain selection circuit; and selecting a gain resistance from the plurality of gain resistances by a gain multiplexer.

16. The method of calibrating the nip measuring device of claim 15, further comprising:

generating, by an operational amplifier, the output of the core analog circuit based on a voltage associated with the gain resistance that was selected at an inverting input of the operational amplifier, and based on a reference voltage at a non-inverting input of the operational amplifier.

17. The method of calibrating the nip measuring device of claim 16, wherein determining the nip sensor resistance based on an output of a core analog circuit and an output of the gain selection circuit comprises:

determining the nip sensor resistance based on based on a current associated with the gain resistance.

18. The method of calibrating the nip measuring device of claim 13, wherein the one or more calibration resistors comprises a single calibration resistor, and wherein a calibration channel line is electrically connected between the calibration resistor and the sensor selection circuit.

19. The method of calibrating the nip measuring device of claim 13, wherein the sensor selection circuit comprises a sensor multiplexer.

20. A nip measuring device circuit configured to calibrate a nip measuring device, the nip measuring device circuit comprising:

a sensor multiplexer configured to receive signals from a sensor array that comprises a plurality of nip sensors that are configured to detect operational parameters of nip rollers;

a gain multiplexer configured to receive a plurality of gain resistances;

a plurality of sensor channel lines electrically connected between respective ones of the plurality of nip sensors and the sensor multiplexer;

a calibration resistor; and a calibration channel line connected between the calibration resistor and the sensor multiplexer, wherein a nip sensor resistance of a selected one of the plurality of nip sensors is determined based on a sampled signal on a respective one of the plurality of sensor channel lines associated with the selected one of the plurality of nip sensors and a respective one of the plurality of gain resistances selected by the gain multiplexer.

\* \* \* \* \*

UNITED STATES PATENT AND TRADEMARK OFFICE
CERTIFICATE OF CORRECTION

PATENT NO. : 11,879,918 B2
APPLICATION NO. : 17/673420
DATED : January 23, 2024
INVENTOR(S) : Wesley C. Van Pelt It is certified that error appears in the above-identified patent and that said Letters Patent is hereby corrected as shown below:

In the Specification

Column 7, Line 24: Please correct "$R_S f(V_{out})*(R_G+R_{Ge})-R_{Se}$" to read --$R_S=f(V_{out})*(R_G+R_{Ge})-R_{Se}$--

Signed and Sealed this
Twenty-third Day of April, 2024

Katherine Kelly Vidal
*Director of the United States Patent and Trademark Office*